(12) United States Patent
Kim et al.

(10) Patent No.: US 10,475,504 B2
(45) Date of Patent: Nov. 12, 2019

(54) INTEGRATED PROTECTING CIRCUIT OF SEMICONDUCTOR DEVICE

(71) Applicant: Samsung Electronics Co., Ltd., Suwon-si (KR)

(72) Inventors: Se-Young Kim, Hwaseong-si (KR); Junbae Kim, Seongnam-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 442 days.

(21) Appl. No.: 15/334,380

(22) Filed: Oct. 26, 2016

(65) Prior Publication Data

US 2017/0125085 A1    May 4, 2017

(30) Foreign Application Priority Data

Nov. 3, 2015   (KR) .................. 10-2015-0153998

(51) Int. Cl.
| | |
|---|---|
| *H02H 9/00* | (2006.01) |
| *G11C 11/4078* | (2006.01) |
| *H01L 27/02* | (2006.01) |
| *H01L 27/108* | (2006.01) |
| *H02H 9/04* | (2006.01) |
| *G11C 5/14* | (2006.01) |
| *G11C 11/4074* | (2006.01) |

(52) U.S. Cl.
CPC ............ *G11C 11/4078* (2013.01); *G11C 5/14* (2013.01); *G11C 11/4074* (2013.01); *H01L 27/0266* (2013.01); *H01L 27/0288* (2013.01); *H01L 27/10897* (2013.01); *H02H 9/046* (2013.01)

(58) Field of Classification Search
None
See application file for complete search history.

(56) References Cited

U.S. PATENT DOCUMENTS

| | | |
|---|---|---|
| 6,249,410 B1 | 6/2001 | Ker et al. |
| 6,388,850 B1 | 5/2002 | Ker et al. |
| 7,187,530 B2 | 3/2007 | Salling et al. |
| 7,522,395 B1 | 4/2009 | Tien et al. |
| 7,541,840 B2 | 6/2009 | Jeon et al. |

(Continued)

FOREIGN PATENT DOCUMENTS

| | | |
|---|---|---|
| JP | 2014-204072 | 10/2014 |
| KR | 10-2008-0034227 | 4/2008 |
| KR | 10-2014-0000334 | 1/2014 |

*Primary Examiner* — Stephen W Jackson
(74) *Attorney, Agent, or Firm* — Muir Patent Law, PLLC

(57) ABSTRACT

Disclosed is an integrated protecting circuit, which detects ESD and EOS pulses to prevent an over-voltage from being applied to a semiconductor device. The integrated protecting circuit includes a first detector configured to detect an occurrence of an electrical over-stress between a first node to which a first voltage is applied and a second node to which a second voltage is applied, a second detector configured to detect an occurrence of an electrostatic discharge between the first and second nodes, a determination circuit configured to receive separate outputs of the first and second detectors at the same time and to generate a control signal, and a clamping device configured to perform a turn on/off operation in response to the control signal such that a voltage between the first and second nodes is clamped into a constant voltage.

20 Claims, 10 Drawing Sheets

(56) References Cited

U.S. PATENT DOCUMENTS

| | | |
|---|---|---|
| 7,782,583 B2 | 8/2010 | Moon |
| 8,531,037 B2 | 9/2013 | Jung et al. |
| 8,576,523 B2 | 11/2013 | Srivastava et al. |
| 2008/0239599 A1* | 10/2008 | Yizraeli ................. H02H 9/046 361/56 |
| 2009/0067106 A1 | 3/2009 | Kim |
| 2009/0154035 A1 | 6/2009 | Galvano et al. |
| 2013/0105951 A1* | 5/2013 | Popovich ............ H01L 27/0251 257/659 |
| 2016/0181796 A1* | 6/2016 | Fifield ................. H01L 27/0285 361/56 |

* cited by examiner

FIG. 3
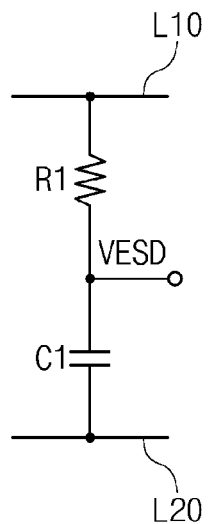
FIG. 4
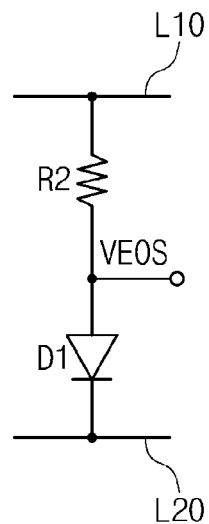
FIG. 5
| | VESD | VEOS | VCTRL | ESD Clamp |
|---|---|---|---|---|
| N/A | 0 | 0 | 1 | ON |
| ESD pulse | 0 | 1 | 1 | ON |
| EOS pulse | 1 | 0 | 1 | ON |
| Normal Condition | 1 | 1 | 0 | OFF |

US 10,475,504 B2

INTEGRATED PROTECTING CIRCUIT OF SEMICONDUCTOR DEVICE

CROSS-REFERENCE TO RELATED APPLICATIONS

A claim for priority under 35 U.S.C. § 119 is made to Korean Patent Application No. 10-2015-0153998 filed Nov. 3, 2015, in the Korean Intellectual Property Office, the entire contents of which are hereby incorporated by reference.

BACKGROUND

The present disclosure relates to a circuit which prevents an over-voltage from being applied to a semiconductor device, and more particularly, relates to an integrated protection circuit of the semiconductor device which is able to prevent a short voltage pulse, such as an electrostatic discharge (ESD) or an electrical over-stress (EOS), from being applied to the semiconductor device.

Electrostatic discharge (ESD) and electrical over-stress (EOS) are different from each other in a transient electrical pulse width. In particular, the electrostatic discharge (ESD) is discharge phenomenon in which a finite amount of positive charge may rapidly move between two objects having different potentials, and the discharge may be made during several hundred picoseconds (ps) to a few microseconds (μs).

Meanwhile, the electrical over-stress (EOS) is an electrical shock such as an abnormal over-current or over-voltage due to leakage current and voltage of equipment which uses a power source, and the EOS may be produced during a few nanoseconds (ns) to a few milliseconds (ms).

When the ESD or the EOS is generated in CMOS-process products, a thin insulating layer such as a gate oxide film may be destroyed. For this reason, there may be a need of a circuit which may protect the thin insulating layer effectively without an increase of the circuit occupying area.

SUMMARY

Embodiments of the inventive concept provide an integrated protection circuit of the semiconductor device capable of preventing a short voltage pulse such as an electrostatic discharge (ESD) or an electrical over-stress (EOS) from being applied to the semiconductor device.

One aspect of embodiments of the inventive concept is directed to provide an integrated protecting circuit of a semiconductor device including a first detector configured to detect an occurrence of an electrical over-stress between a first node to which a first voltage is applied and a second node to which a second voltage is applied, a second detector configured to detect an occurrence of an electrostatic discharge between the first and second nodes, a determination circuit configured to receive separate outputs of the first and second detectors at the same time and to generate a control signal based on the received outputs, wherein the determination circuit is configured to output the control signal having a first value when either the first detector detects the occurrence of the electrical over-stress between the first and second nodes or the second detector detects the occurrence of the electrostatic discharge between the first and second nodes, and when both the first detector detects the occurrence of the electrical over-stress and the second detector detects the occurrence of the electrostatic discharge; and a clamping device configured to perform a turn on/off operation in response to the control signal having the first value, such that a voltage between the first and second nodes is clamped into a constant voltage.

Another aspect of embodiments of the inventive concept is directed to an integrated protecting circuit of a semiconductor device. The integrated protecting circuit may include: a first detector configured to detect an electrical over-stress (EOS) pulse between a first node to which a first voltage is applied and a second node to which a second voltage is applied to generate an EOS output signal; a second detector configured to detect an electrostatic discharge (ESD) pulse between the first and second nodes to generate an ESD output signal; a NAND gate configured to receive the EOS output signal and the ESD output signal at the same time and to generate a control signal based on a NAND response; and a gate-coupled MOS transistor configured to perform a turn on/off operation in response to the control signal such that a voltage between the first and second nodes is clamped into a constant voltage when the control signal has a first value.

BRIEF DESCRIPTION OF THE FIGURES

The above and other objects and features will become apparent from the following description with reference to the following figures, wherein like reference numerals refer to like parts throughout the various figures unless otherwise specified, and wherein:

FIG. 3 is a detailed circuit diagram illustrating an ESD detector of FIG. 2 according to an exemplary embodiment;

FIG. 4 is a detailed circuit diagram illustrating an EOS detector of FIG. 2 according to an exemplary embodiment;

FIG. 5 is a table illustrating a table relative to an operation of the integrated protection circuit of FIG. 2 according to an exemplary embodiment;

DETAILED DESCRIPTION

Figure 1:
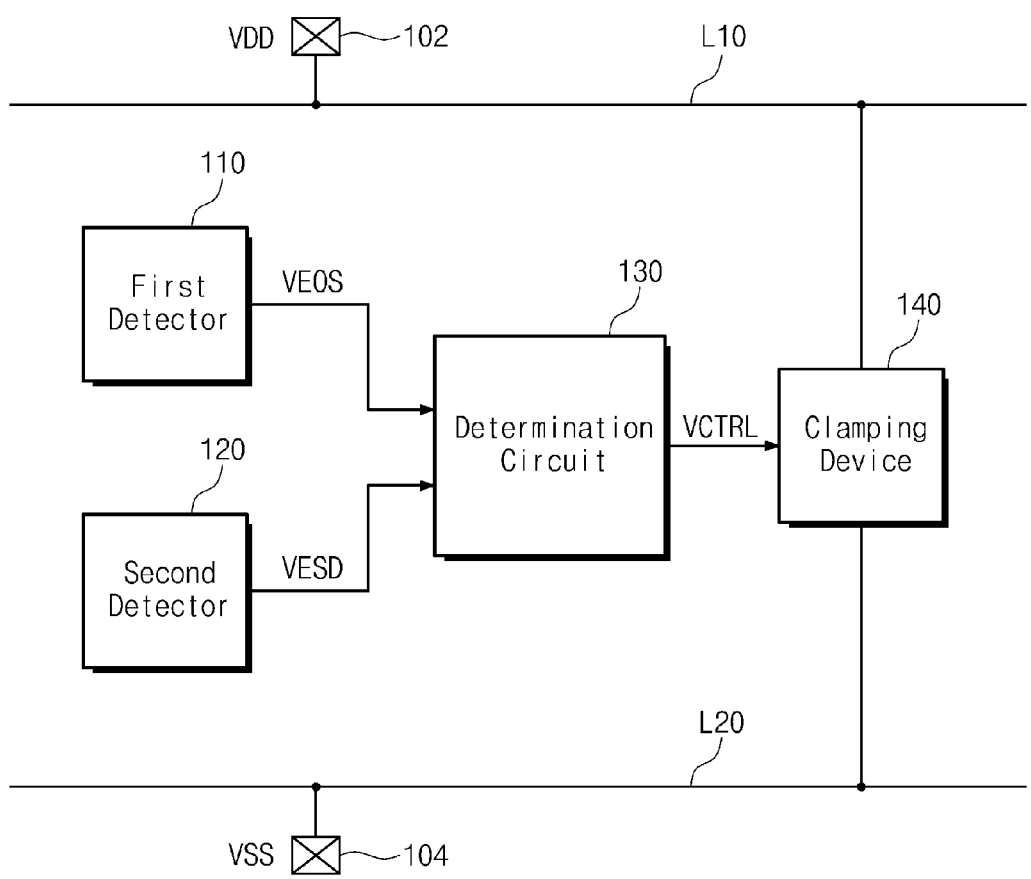
FIG. 1 is a block diagram illustrating an integrated protection circuit according to an exemplary embodiment of the inventive concept.

As described above, object, other objects, features, and advantages of the inventive concept will be readily understood through the following preferred embodiments in connection with the accompanying drawings. The invention may, however, be embodied in many different forms and should not be construed as limited to the example embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, the size and relative sizes of layers and regions may be exaggerated for clarity. Like numbers refer to like elements throughout. Though the different figures show variations of exemplary embodiments, these figures are not necessarily intended to be mutually exclusive from each other. Rather, as will be seen from the context of the detailed description below, certain features depicted and described in different figures can be combined with other features from other figures to result in various embodiments, when taking the figures and their description as a whole into consideration.

Although the figures described herein may be referred to using language such as "one embodiment," or "certain embodiments," these figures, and their corresponding descriptions are not intended to be mutually exclusive from other figures or descriptions, unless the context so indicates. Therefore, certain aspects from certain figures may be the same as certain features in other figures, and/or certain figures may be different representations or different portions of a particular exemplary embodiment.

It will be understood that when a component is referred to as being "placed on", "connected to", or "coupled to" another component, it can be directly placed on, connected to, or coupled to the other component, or an intervening component(s) may also be present. On the other hand, when a component is referred to as being "directly placed on", "directly connected to", or "directly coupled to" another element, an intervening component(s) is not present.

The terminology used herein is only for the purpose of describing specific embodiments and is not intended to limit the inventive concept. As used herein, the singular terms "a," "an" and "the" are intended to include the plural forms as well, unless the context clearly indicates otherwise. It will be understood that the terms such as "comprises", "comprising", "includes", "including", "has", and "having", when used herein, specify the presence of stated features, numbers, steps, operations, members, elements, and/or groups thereof, but do not preclude the presence or addition of one or more other features, numbers, steps, operations, members, elements, and/or groups thereof.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

In addition, the same or similar reference numerals in the drawings indicate the same or similar components as much as possible. In some drawings, the connection relationship between the elements and the line as it is shown for an effective description of the technical content, the other element or circuit blocks may be further provided.

The embodiments described herein and illustrated may be included and its complementary embodiments may also be included. Detailed description about an internal function circuit for performing a basic operation of an electrostatic discharge (ESD) or electrical over-stress (EOS) circuit is not described in detail so as not to obscure the subject matter of the disclosed invention.

In designing an integrated circuit, an ESD protection circuit for protecting an internal circuit such as a semiconductor device generated from an external device may be required. Recently, as high-speed and low-power integrated circuits are developed, the ESD protection circuit may affect a chip area and an operating speed. In addition, as well as the ESD, an EOS generated from the external device may also adversely affect the efficiency of integrated circuit. For this reason, an additional protection circuit may also be required. Thus, a trade-off between the chip area and an ESD/EOS protection performance may become important.

FIG. 1 is a block diagram illustrating an integrated protection circuit according to an exemplary embodiment of the inventive concept.

Referring to FIG. 1, an integrated protection circuit may include a first detector 110, a second detector 120, a determination circuit 130, and a clamping device 140 (e.g., a clamping element, also referred to as a clamping circuit).

The first detector 110 may be an electrical over-stress (EOS) detector which detects an occurrence of an electrical over-stress between a first node to which a first voltage is applied and a second node to which a second voltage is applied.

The second detector 120 may be an electrostatic discharge (ESD) detector which detects an occurrence of static electricity between the first and second nodes.

The determination circuit 130 may be a logic gate which receive outputs VEOS and VESD of the first and second detectors 110 and 120, respectively, and generates a control signal, e.g., control voltage VCTRL based on the received outputs VEOS and VESD. The determination circuit 130 may output a control signal (e.g., control voltage VCTRL) when either the first detector 110 detects an occurrence of an EOS and outputs VEOS or the second detector 120 detects an occurrence of an ESD and outputs VESD. The determination circuit 130 may also output a control signal (e.g., control voltage VCTRL) when both the first detector 110 detects an occurrence of an EOS and outputs VEOS and the second detector 120 detects an occurrence of an ESD and outputs VESD.

The clamping device 140 may be a MOS transistor which is turned on/off in response to the control voltage VCTRL such that a voltage between the first and second nodes is clamped into a constant voltage.

When the MOS transistor is a NMOS transistor, a drain of the MOS transistor may be connected to a line L10, and a source thereof may be connected to a line L20. The line L10 may be connected to a first voltage (VDD) pad 102, and the line L20 may be connected to a second voltage (VSS) pad 104. The first node may exist at the line L10, and the second node may exist at the line L20.

The various pads of a device described herein may be conductive terminals connected to internal wiring of the device, and may transmit signals and/or supply voltages between an internal wiring and/or internal circuit of the device and an external source. For example, chip pads of a semiconductor chip may electrically connect to and transmit supply voltages and/or signals between an integrated circuit of the semiconductor chip and a device to which the semiconductor chip is connected. The various pads may be provided on or near an external surface of the device and may generally have a planar surface area (often larger than a corresponding surface area of the internal wiring to which they are connected) to promote connection to a further terminal, such as a bump or solder ball, and/or an external wiring.

A gate coupled NMOS (GCNMOS) transistor as an ESD protection device widely employed in a limited chip area may be controlled by a NAND gate, and the NAND gate may receive outputs of the EDS and EOS detectors, thereby improving efficiency in terms of the area where a circuit is implemented.

Figure 2:
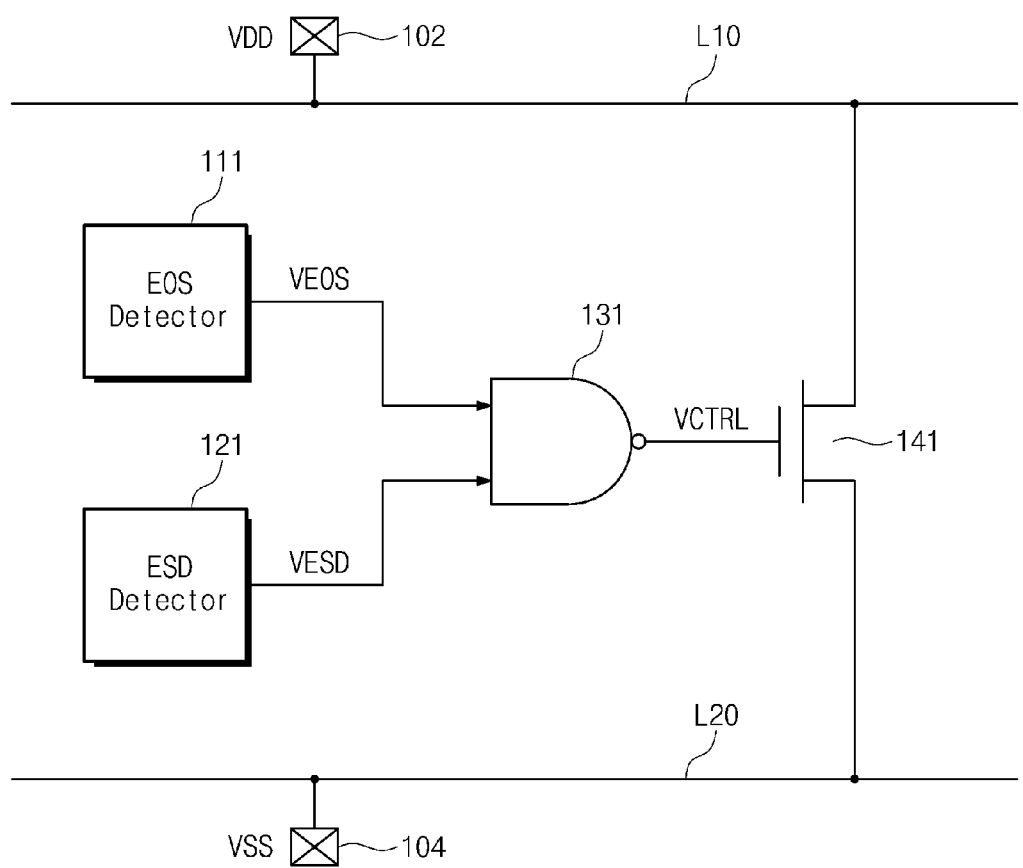
FIG. 2 is a block diagram illustrating an integrated protection circuit according to an exemplary embodiment implemented in FIG. 1.

FIG. 2 is a block diagram illustrating an example of an integrated protection circuit according to an embodiment of the inventive concept.

Referring to FIG. 2, an EOS detector 111 may correspond to the first detector 110 of FIG. 1, and an ESD detector 121 may correspond to the second detector 120 of FIG. 1.

A NAND gate 131 may perform a role of the determination circuit 130 of FIG. 1. For example, the NAND gate 131 may output a control signal (e.g., control voltage VCTRL) when either the EOS detector 111 detects an occurrence of an EOS and outputs VEOS or the ESD detector 121 detects an occurrence of an ESD and outputs VESD. The NAND gate 131 may also output a control signal (e.g., control voltage VCTRL) when both the EOS detector 111 detects an occurrence of an EOS and outputs VEOS and the ESD detector 121 detects an occurrence of an ESD and outputs VESD. An NMOS transistor 141 may perform a role of the clamping device 140 of FIG. 1. For example, the NMOS transistor 141 may be turned on/off in response to the control voltage VCTRL such that a voltage between the first and second nodes is clamped into a constant voltage.

The NMOS transistor 141 according to an embodiment of the inventive concept may be a gate-coupled NMOS (GCN-MOS) transistor which does not include a silicide blocking layer (hereinafter referred to as "SBL") and may be a BigFET manufactured to have a very large channel size.

When the EOS detector 111 detects an EOS pulse to generate an output VEOS or when the ESD detector 121 detects an ESD pulse to generate an output VESD, an output of the NAND gate 131 may go to a logical high state. For this reason, the NMOS transistor 141 may be turned on, and a current may flow through a drain-source channel thereof. As a result, while the output of the NAND gate 131 maintains the logical high state, the NMOS transistor 141 may be turned on. This may be called a clamping operation. Meanwhile, when the EOS detector 111 detects an EOS pulse to generate an output VEOS and when the ESD detector 121 detects an ESD pulse to generate an output VESD, the output of the NAND gate 131 maintains a logical LOW state (LOW="0"). When the output of the NAND gate 131 maintains a logical LOW state (LOW="0"), the NMOS transistor 141 may be turned off, and no current may flow through a drain-source channel thereof. As a result, the clamping operation may be stopped.

FIG. 3 is a detailed circuit diagram illustrating an ESD detector of FIG. 2 according to an exemplary embodiment.

Referring to FIG. 3, a resistor R1 and a capacitor C1 may be serially connected between lines L10 and L20. The output VESD may be obtained from a connection node between the resistor R1 and the capacitor C1. When a relatively fast rising pulse, for example, the ESD pulse is applied to the ESD detector, the output VESD may go to a logical low (LOW="0") state by the coupling of the capacitor C1. As a result, the ESD detector of FIG. 3 may function as an RC voltage divider and may output the output VESD of the logical low state when a fast rising signal such as the ESD pulse is received.

FIG. 4 is a detailed circuit diagram illustrating an EOS detector of FIG. 2 according to an exemplary embodiment.

Referring to FIG. 4, a resistor R2 and a diode D1 may be serially connected between lines L10 and L20. The output VEOS may be obtained from a connection node between the resistor R2 and the diode D1. When a voltage between the lines L10 and L20 is greater than a turn-on voltage of the diode D1, the output VEOS may go to a logical low (LOW="0") state. An EOS detector of FIG. 4 may operate as a voltage divider which uses the resistor and the diode and may generate the output VEOS of the logical low state when an over-voltage such as the EOS pulse is received.

FIG. 5 is a diagram illustrating a table associated with an operation of FIG. 2 according to an exemplary embodiment.

Referring to FIG. 5, the table illustrates examples in which the NMOS transistor 141 is turned on/off depending on the output of the NAND gate 131. For example, when a logical high "1" is applied to a gate of the NMOS transistor 141, the NMOS transistor 141 may be turned on, and thus a clamping operation may be performed and when a logical low "0" is applied to a gate of the NMOS transistor 141, the NMOS transistor 141 may be turned off, and thus a clamping operation may not be performed.

In some embodiments, the NAND gate 131 may output a logical high (HIGH="1") under other conditions except for a normal condition in which the outputs VEOS and VESD are logical high. For example, when both outputs VEOS and VESD are low, or when only the output VESD is low, or when only the output VEOS is low, the NAND gate 131 may output the logical high. Therefore, when only the ESD pulse is detected by the ESD detector 121 and no EOS pulse is detected by the EOS detector 111, the NMOS transistor 141 may be activated by a gating operation of the NAND gate 131, and thus the clamping operation may be performed. When only the EOS pulse is detected by the EOS detector 111 and no ESD pulse is detected by the ESD detector 121, the NMOS transistor 141 may be activated by a gating operation of the NAND gate 131, and thus the clamping operation may be performed. When both the ESD and EOS pulses are detected by the ESD detector 121 and EOS detector 111, respectively, the NMOS transistor 141 may be activated by a gating operation of the NAND gate 131, and thus the clamping operation may be performed. With the above description, a circuit configuration may be simple, and the ESD and EOS pulses may be effectively removed.

Figure 6:
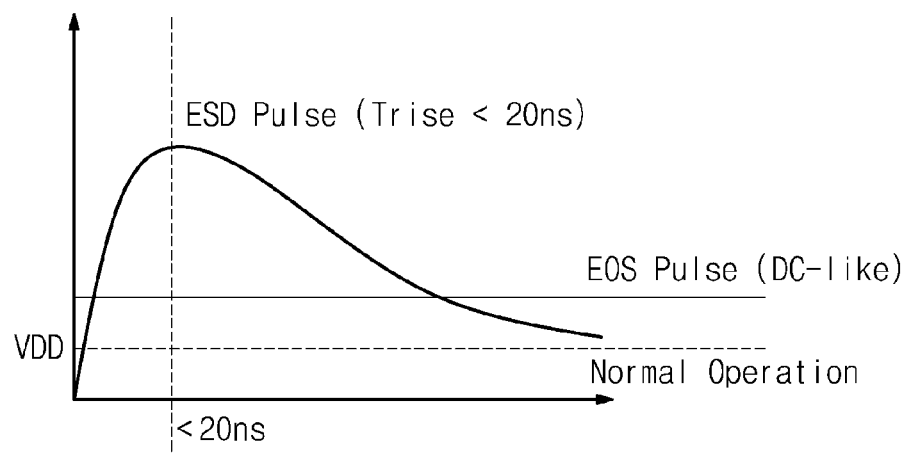
FIG. 6 is a graph illustrating typical ESD and EOS pulses.
Figure 7:
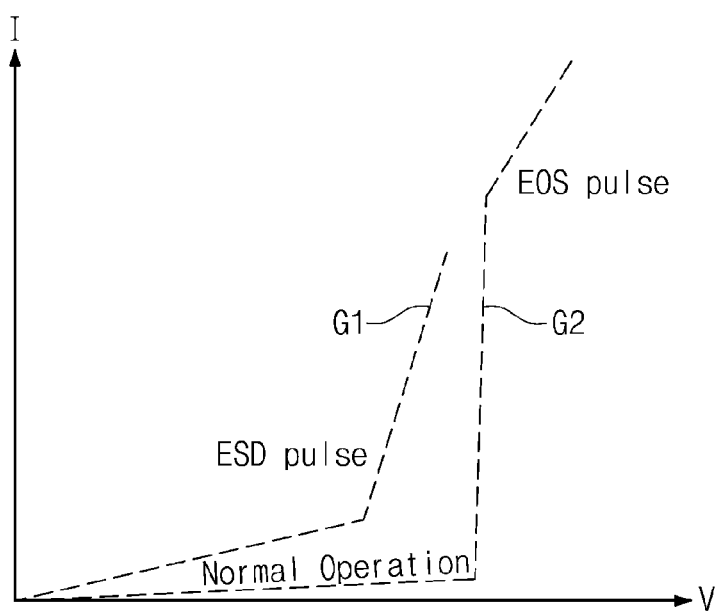
FIG. 7 is a graph illustrating I-V characteristics of a circuit as shown in FIG. 2 according to an exemplary embodiment.

FIG. 6 is a graph illustrating exemplary ESD and EOS pulses. FIG. 7 is a graph illustrating an I-V characteristic of a circuit shown in FIG. 2.

Referring to FIG. 6, a horizontal axis denotes time, and a vertical axis denotes a voltage. In a voltage response of FIG. 6, an ESD pulse is a pulse of which the duration is 20 ns or less, and a level of an EOS pulse is similar to that of a DC and higher than that of a power supply voltage VDD.

As such, the ESD and EOS pulses are distinguished from each other in terms of a transient electrical pulse width. A dotted line on the horizontal axis in FIG. 6 denotes an ideal voltage response during a normal operation.

Referring to FIG. 7, a horizontal axis denotes a voltage, and a vertical axis denotes a current. In FIG. 7, a graph G1 indicates a removal characteristic of the ESD pulse, and a graph G2 indicates a removal characteristic of the EOS pulse. Since a voltage of the EOS pulse is higher than that of the ESD pulse when the same current level is used, the graph G2 may be placed at the right of the drawing associated with the graph G1.

An integrated protection circuit according to an exemplary embodiment of the inventive concept may prevent an EOS or ESD pulse from flowing into a semiconductor device such as a processor, a DRAM, or a nonvolatile memory device.

Generally, the ESD pulse may refer to a fast transient current having a rise time of a few nanoseconds to dozens of nanoseconds, and the EOS pulse may refer to a DC current which operates slowly. Thus, generally, the integrated protection circuit may have detectors different from each other, and may be independently installed, thereby increasing a circuit implementation area of the integrated protection circuit. Thus, according to the exemplary embodiments disclosed herein, providing a gate-coupled NMOS (GCN-MOS) transistor (e.g., the NMOS transistor 141 of FIG. 2) to be shared by the two detectors (e.g., the ESD detector 121 and the EOS detector 111) through the determination circuit such as a NAND gate 131, may increase efficiency in terms of the area of the integrated protection circuit.

Compared with a conventional circuit, area efficiency of an integrated protection circuit according to an exemplary embodiment of the inventive concept may be doubled. Although an area of the detectors increases based on an installation area of the detectors, when an area ratio of the detectors to the GCNMOS transistors is 1:N, where N is a positive integer, the area penalty may be minimized. Thus, the GCNMOS transistor may maintain an OFF state, in which the ESD and EOS pulses are not inputted, that is, a current may not flow during a normal operation.

As a result, according to an embodiment of the inventive concept, although different pulses are received, since an operation of an integration protection circuit is configured to share a GCNMOS transistor, an occupied area of the circuit may be minimized, and the EOS and ESD protection performance may be maximized.

Figure 8:
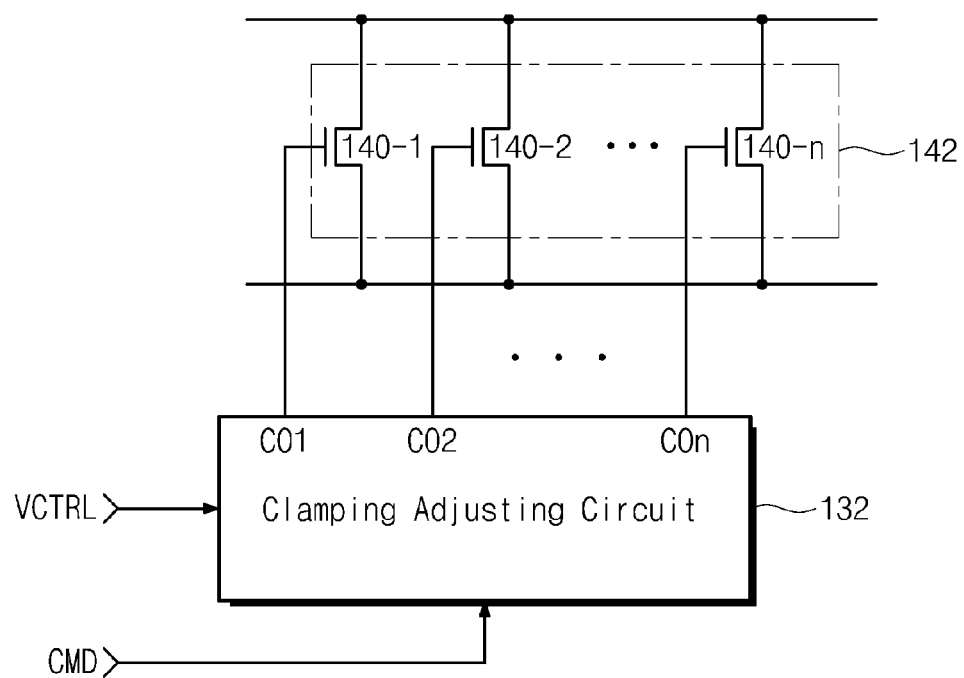
FIG. 8 is a diagram illustrating an exemplary expansion embodiment of a clamping device of FIG. 1.

FIG. 8 is a diagram illustrating an exemplary expansion embodiment of a clamping device of FIG. 1.

Referring to FIG. 8, an exemplary expansion embodiment of a clamping device 140 of FIG. 1 is showed. Clamping device 140 described herein (e.g., with respect to FIG. 1) may be embodied by the novel clamping devices described herein, such as NMOS transistor 141 (e.g., of FIG. 2), including the exemplary implementations of clamping device 142 (e.g., of FIG. 8). The clamping device 142 of FIG. 8 may include a plurality of transistors 140-1 to 140-$n$. Here, n may be a natural number of 2 or more. In some embodiments, each of the plurality of transistors 140-1 to 140-$n$ may be a MOS transistor.

In this exemplary embodiment, the clamping device 142 may be controlled by a clamping adjusting circuit 132. The clamping adjusting circuit 132 may receive a control voltage VCTRL and a command CMD and may generate adjustment control signals for adjusting a clamping strength. For example, when an adjustment control signal outputted from a first output terminal CO1 is in a logical high state, a first MOS transistor 140-1 may be turned on to perform a clamping operation. For example, when an adjustment control signal outputted from the first output terminal CO1 is in a logic low state, the first MOS transistor 140-1 may be turned off not to perform the clamping operation.

As a result, a clamping level may be adjusted according to a command as a plurality of MOS transistor 140-1 to 140-$n$ are independently controlled. Here, the command may include a mode register set (MRS) command as well as commands such as an active command, a read command, and a write command of the semiconductor memory device. During a normal operation or a standby operation mode of the semiconductor memory device, the clamping level may be independently controlled.

Figure 9:
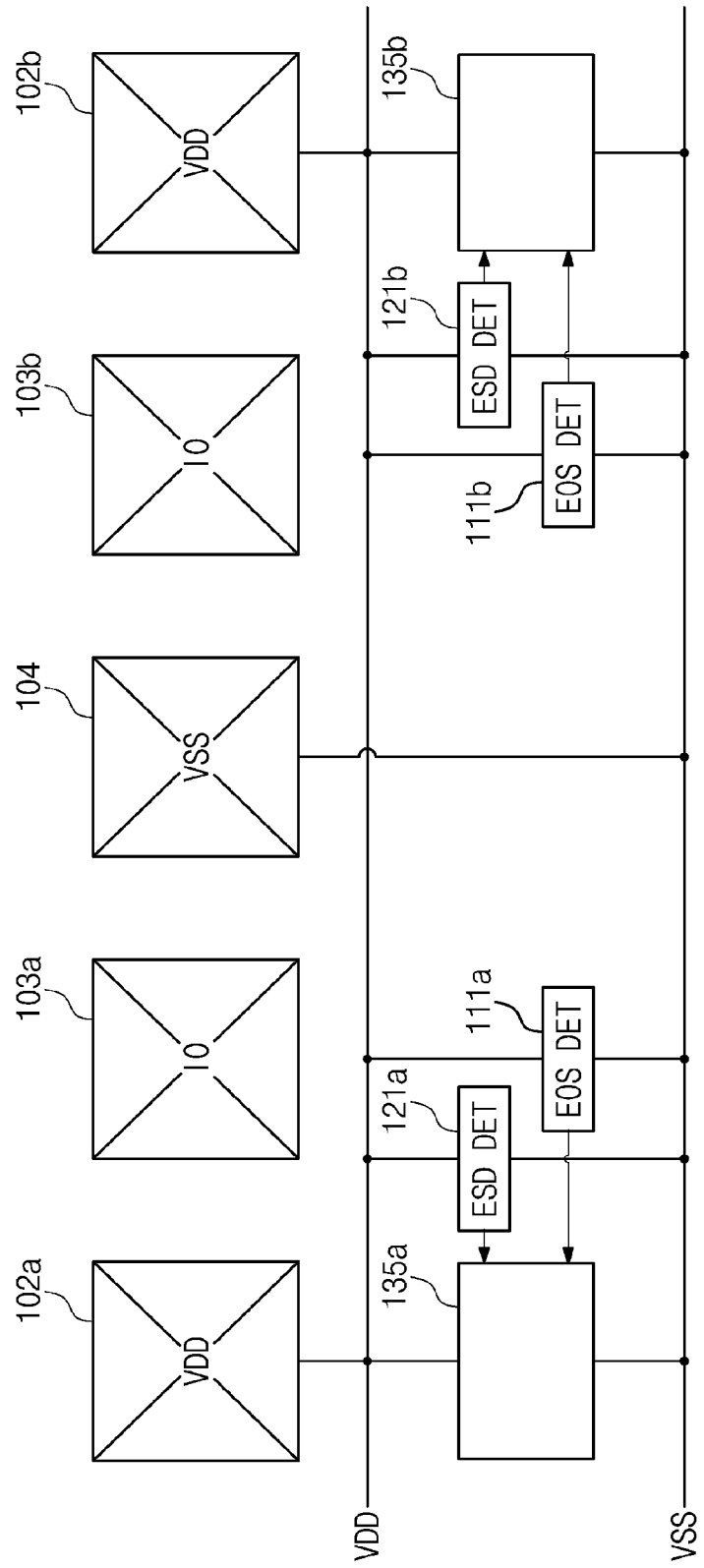
FIG. 9 is a diagram illustrating a use of detectors according to an exemplary embodiment of the inventive concept.

FIG. 9 is a diagram illustrating a use of detectors according to an exemplary embodiment of the inventive concept.

Referring to FIG. 9, a first determination and clamping block 135$a$ (e.g., determination and clamping circuit) connected between a power supply voltage VDD applied through a power supply voltage pad 102$a$ and a ground voltage VSS applied through a ground voltage pad 104 may receive outputs of an ESD detector 121$a$ and an EOS detector 111$a$. In addition, the second determination and clamping block 135$b$ (e.g., determination and clamping circuit) connected between the power supply voltage VDD applied through a power supply voltage pad 102$b$ and the ground voltage VSS applied through a ground voltage pad 104 may receive outputs of an ESD detector 121$b$ and an EOS detector 111$b$. ESD detector 121 described herein (e.g., with respect to FIG. 2) may be embodied by the novel ESD detectors described herein, such as ESD detectors 121$a$, 121$b$ (e.g., of FIG. 9), including the exemplary implementations of ESD detector 121 (e.g., of FIG. 10). EOS detector 111 described herein (e.g., with respect to FIG. 2) may be embodied by the novel EOS detectors described herein, such as EOS detectors 111$a$, 111$b$ (e.g., of FIG. 9), including the exemplary implementations of EOS detector 111 (e.g., of FIG. 10).

In this exemplary embodiment, each of the first and second determination and clamping blocks 135$a$ and 135$b$ may include the NAND gate 131 and the NMOS transistor 141 (e.g., GCMNOS transistor) of FIG. 2.

Thus, according to this exemplary embodiment, the ESD pulse or the EOS pulse applied through the power supply voltage pad 102$a$ may be removed by the first determination and clamping block 135$a$, and the ESD pulse or the EOS pulse applied through the power supply voltage pad 102$b$ may be removed by the second determination and clamping block 135$b$. As described above, when the semiconductor device is integrally protected by clamping ESD and EOS pulse currents having different characteristics from each other using one gate coupled NMOS transistor (i.e., an ESD protection device), the area efficiency of the semiconductor device may be improved.

Conventionally, the ESD protection circuit and the EOS protection circuit have been independently implemented. Since the conventional GCNMOS transistor connected to the ESD detector operates only with respect to the ESD pulse and since another conventional GCNMOS transistor connected to the EOS detector operates only with respect to the EOS pulse, the area penalty of the semiconductor device may exist. However, since an embodiment of the inventive concept shares one GCNMOS transistor without impeding the characteristic of a circuit for removals of the ESD and EOS pulses, an increase in efficiency in terms of an area occupied by a chip may be achieved.

As illustrated in FIG. 9, when the number of determination and clamping blocks and the number of detectors is 1:1, two ESD detectors may operate two GCNMOS transistors, respectively. Thus, compared to conventional technology, an ESD performance of the semiconductor device according to the disclosed embodiments may increase two times on a basis of the same area. Likewise, the EOS detector may have a structure in which two different GCNMOS transistors are used, and thus the EOS performance may also increase two times. In this case, when a GCNMOS transistor is connected to a detector for the area efficiency, the same performance may be obtained with half the area compared with FIG. 9.

Figure 10:
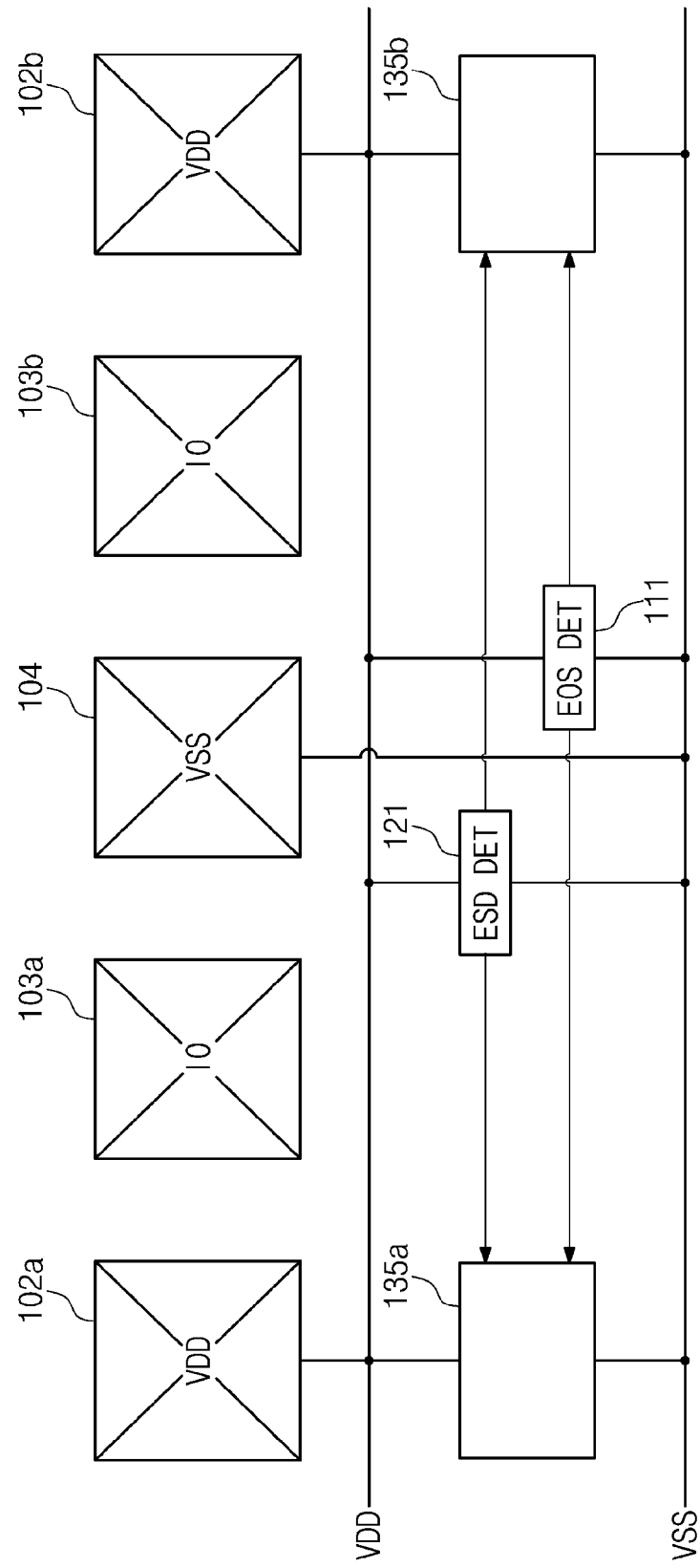
FIG. 10 is a diagram illustrating another use of detectors according to an exemplary embodiment of the inventive concept.

FIG. 10 is a diagram illustrating another use of detectors according to an exemplary embodiment of the inventive concept.

Referring to FIG. 10, a first determination and clamping block 135a (e.g., determination and clamping circuitry) connected between a power supply voltage VDD applied through a power supply voltage pad 102a and a ground voltage VSS applied through a ground voltage pad 104 may receive outputs of the ESD detector 121 and the EOS detector 111. In addition, a second determination and clamping block 135b (e.g., determination and clamping circuitry) connected between the power supply voltage VDD applied through the power supply voltage pad 102a and the ground voltage VSS applied through the ground voltage pad 104 may also receive the outputs of the ESD detector 121 and the EOS detector 111.

In this exemplary embodiment, each of the first and second determination and clamping blocks 135a and 135b may include the NAND gate 131 and the NMOS transistor 141 (e.g., GCNMOS transistor) of FIG. 2.

The ESD detector 121 and the EOS detector 111 may be shared by the first determination and clamping block 135a and the second determination and clamping block 135b.

As illustrated in FIG. 10, when the number of determination and clamping blocks to the number of detectors is 2:1, performance may increase twice, and an area may be additionally optimized compared with FIG. 9. When the number of the GCNMOS transistors to the number of the detectors is set to N:1 based on a chip layout situation, an area penalty may be further reduced by the number of the detectors which share the GCNMOS transistors. Here, N is a natural number of 2 or more.

Figure 11:
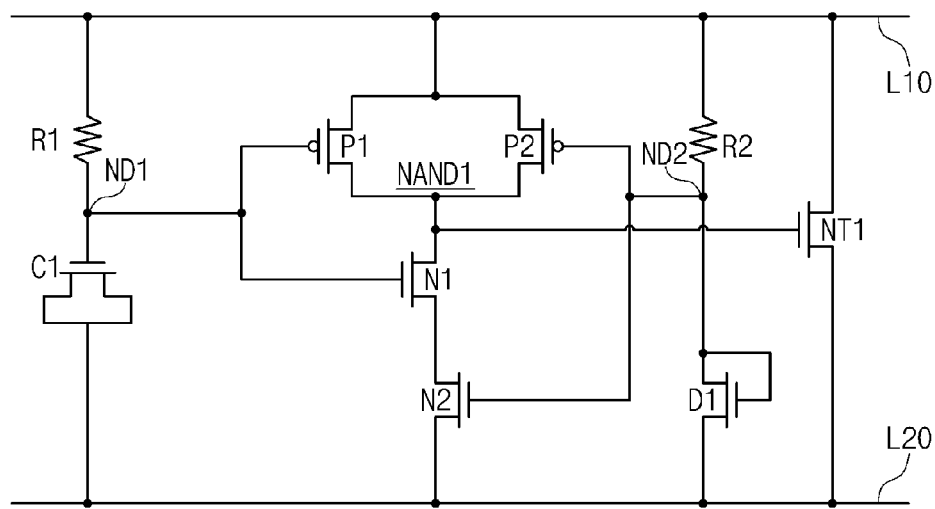
FIG. 11 is a diagram illustrating a detailed circuit according to a circuit implemented in FIG. 2 according to an exemplary embodiment.

FIG. 11 is a diagram illustrating a detailed circuit according to a circuit implemented in FIG. 2 according to an exemplary embodiment.

Referring to FIG. 11, a resistor R1 and a capacitor C1 may constitute an ESD detector 121. A resistor R2 and a diode D1 may constitute an EOS detector 111. PMOS transistors P1 and P2 and NMOS transistors N1 and N2 may constitute a NAND gate 131 of FIG. 2. An NMOS transistor NT1 may function as a NMOS transistor 141 of FIG. 2 (e.g., GCNMOS transistor) and may be used as the clamping device of FIG. 2.

The output VESD of the ESD detector 121 may be generated at a node ND1. The output VEOS of the EOS detector 111 may be generated at a node ND2. The output VESD of the ESD detector 121 may be connected to a gate of the PMOS transistor P1 and a gate of the NMOS transistor N1. The output VEOS of the EOS detector 111 may be connected to a gate of PMOS transistor P2 and a gate of the NMOS transistor N2. An output of a NAND gate NAND1 may be connected to a gate of the NMOS transistor NT1. An output of a NAND gate NAND1 may also be connected to a drain of the NMOS transistor N1 and a source of the NMOS transistor N1 may be connected to a drain of the NMOS transistor N2.

In the integrated protection circuit of FIG. 11, since a circuit component is minimized and simple, an area occupied by a chip may be minimized.

Figure 12:
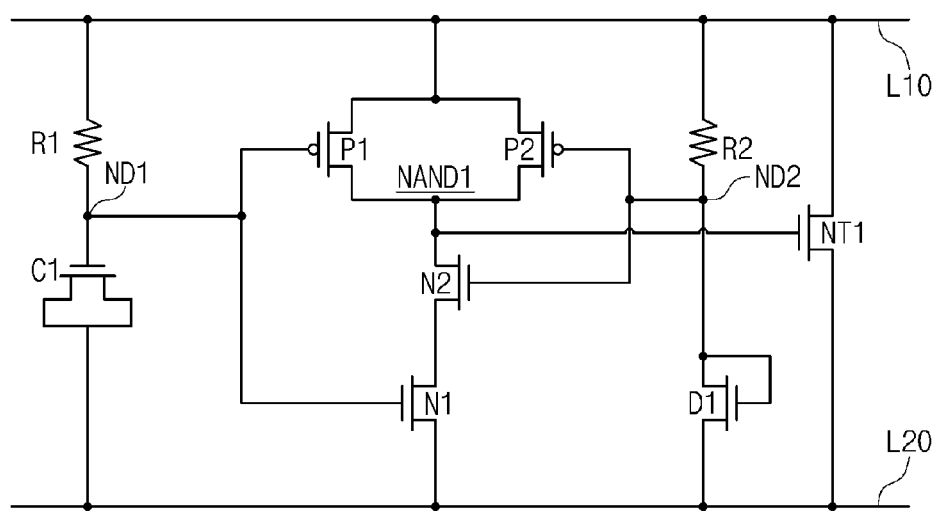
FIG. 12 is a diagram illustrating a modified detailed circuit of FIG. 11 according to an exemplary embodiment.

FIG. 12 is a diagram illustrating a modified detailed circuit of FIG. 11 according to an exemplary embodiment.

Referring to FIG. 12, a resistor R1 and a capacitor C1 may constitute an ESD detector 121. A resistor R2 and a diode D1 may constitute an EOS detector 111. PMOS transistors P1 and P2 and NMOS transistors N2 and N1 may constitute the NAND gate 131 of FIG. 2. An NMOS transistor NT1 may function as the NMOS transistor 141 (e.g., GCNMOS transistor) and may form the clamping device of FIG. 2.

The output VESD of the ESD detector 121 may be generated at the node ND1, the output VEOS of the EOS detector 111 may be generated at the node ND2. An output of a NAND gate NAND 1 may be connected to a gate of the NMOS transistor NT1. For example, the output VESD of the ESD detector 121 may be connected to a gate of the PMOS transistor P1 and a gate of the NMOS transistor N1. The output VEOS of the EOS detector 111 may be connected to a gates of PMOS transistor P2 and a gate of the NMOS transistor N2.

A circuit of FIG. 12 may differ from that of FIG. 11 in that an order in which NMOS transistors N2 and N1 constituting the NAND gate NAND1 are connected is changed. For example, in the circuit of FIG. 12, the output VESD of the ESD detector 121 may be connected to a gate of the PMOS transistor P1 and a gate of the NMOS transistor N1, the output VEOS of the EOS detector 111 may be connected to a gate of PMOS transistor P2 and a gate of the NMOS transistor N2, an output of a NAND gate NAND1 may be connected to a drain of the NMOS transistor N2 (instead of a drain of the NMOS transistor N1 as illustrated in FIG. 11) and a source of the NMOS transistor N2 may be connected to a drain of the NMOS transistor N1.

Figure 13:
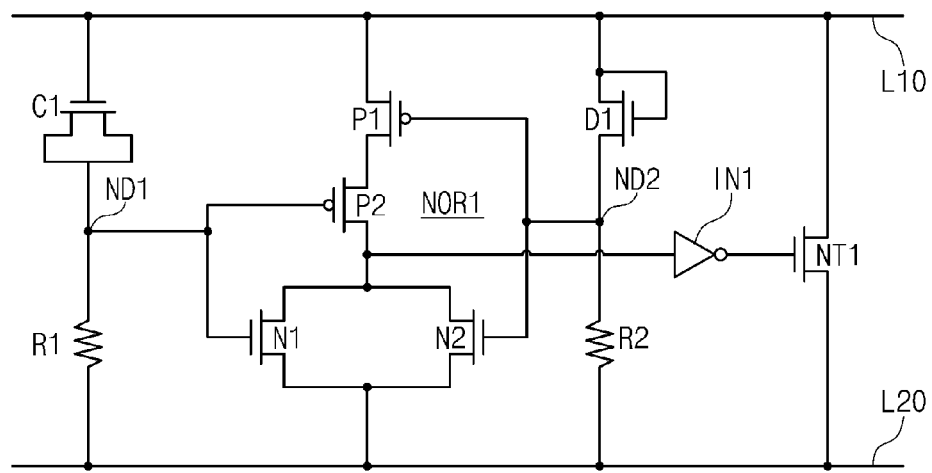
FIG. 13 is a diagram illustrating another modified detailed circuit of FIG. 11 according to an exemplary embodiment.

FIG. 13 is a diagram illustrating another modified detailed circuit of FIG. 11 according to an exemplary embodiment.

Referring to FIG. 13, a resistor R1 and a capacitor C1 may constitute an ESD detector 121. A resistor R2 and a diode D1 may constitute an EOS detector 111. PMOS transistors P1 and P2 and NMOS transistors N2 and N1 may constitute a NOR gate NOR1. The NOR gate NOR1 may be connected to an inverter IN1 so as to constitute the NAND gate 131 of FIG. 2 together therewith. An NMOS transistor NT1 may function as the GCNMOS transistor and may be used as the clamping device 141 of FIG. 2.

The output VESD of the ESD detector 121 may be generated at the node ND1, and the output VEOS of the EOS detector 111 may be generated at the node ND2. An output of the NOR gate NOR1 may be coupled to an input of the inverter IN1.

The circuit of FIG. 13 may differ from that of FIG. 12 in that an order in which NMOS transistors N2 and N1 constituting the NAND gate NAND1 are connected is changed and that circuit elements constituting one NAND gate are changed into a combination of the NOR gate and the inverter. For example, in the circuit of FIG. 13, the output VESD of the ESD detector 121 may be connected to a gate of the PMOS transistor P2 and a gate of the NMOS transistor N1, the output VEOS of the EOS detector 111 may be connected to a gate of PMOS transistor P1 and a gate of the NMOS transistor N2. An output of a NOR gate NOR1 may also be connected to a source of the PMOS transistor P2 and a drain of the PMOS transistor P2 may be connected to a source of the PMOS transistor P1.

Figure 14:
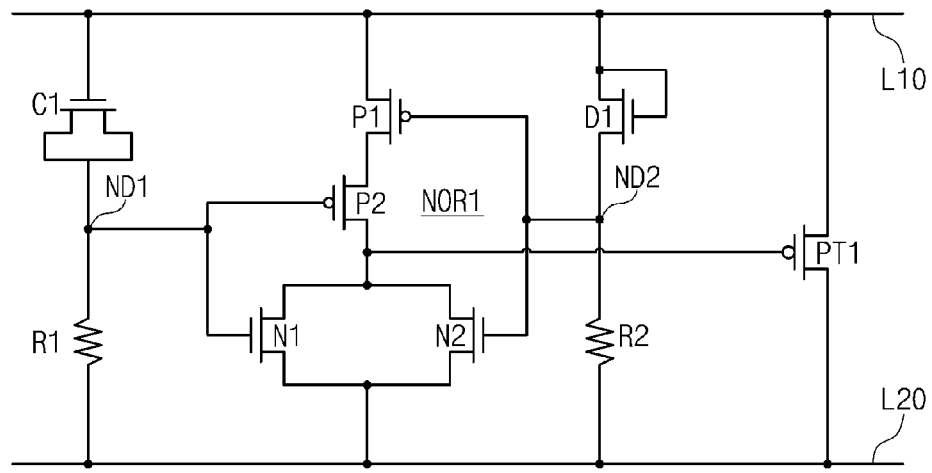
FIG. 14 is a diagram illustrating another modified detailed circuit of FIG. 11 according to an exemplary embodiment.

FIG. 14 is a diagram illustrating another modified detailed circuit of FIG. 11 according to an exemplary embodiment.

Referring to FIG. 14, a resistor R1 and a capacitor C1 may constitute an ESD detector 121 of FIG. 2. A resistor R2 and a diode D1 may constitute an EOS detector 111. PMOS transistors P1 and P2 and NMOS transistors N2 and N1 may constitute a NOR gate NOR1. Unlike FIG. 13, the NOR gate NOR 1 may not be connected to the inverter IN1. A PMOS transistor PT1 may functions as a GCPMOS transistor and may correspond to the clamping device 141 of FIG. 2.

The output VESD of the ESD detector 121 may be generated at the node ND1, and the output VEOS of the EOS detector 111 may be generated at the node ND2. An output of the NOR gate NOR 1 may be directly connected to a gate of the PMOS transistor PT 1.

A circuit of FIG. 14 may differ from that of FIG. 13 in that the inverter is removed and that an output of a NOR gate is directly connected to a gate of a PMOS transistor PT11.

Figure 15:
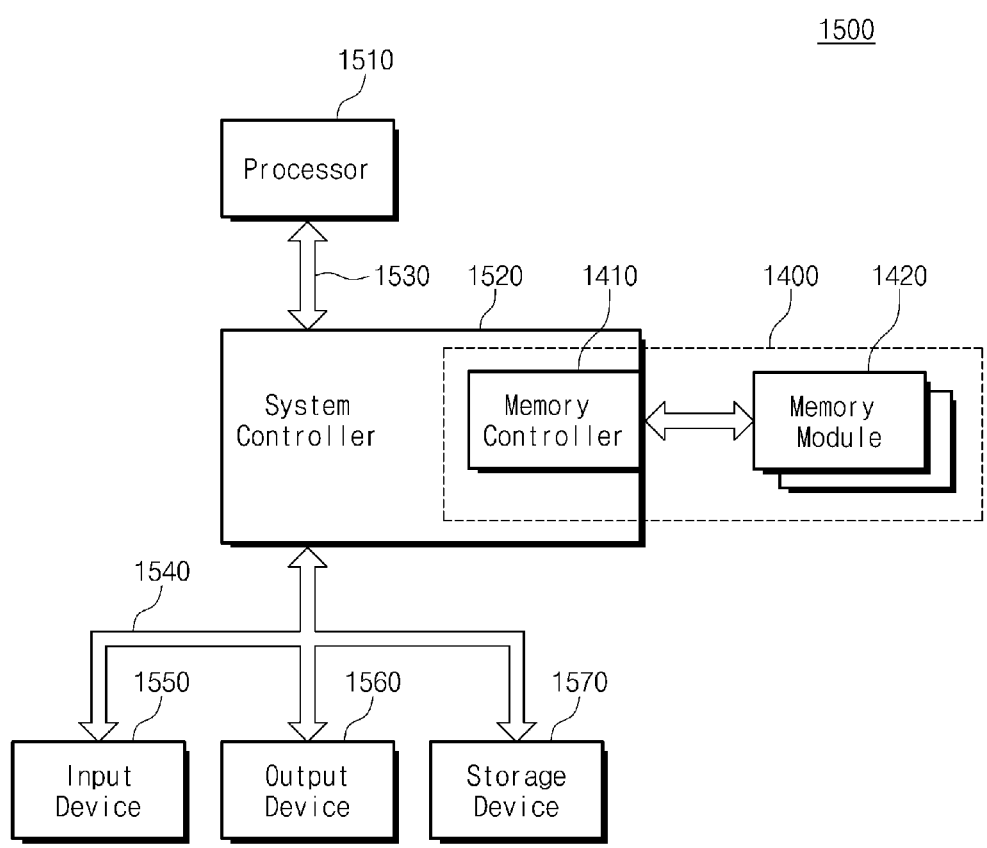
FIG. 15 is a block diagram illustrating an application example applied to a computing system according to an exemplary embodiment of the inventive concept.

FIG. 15 is a block diagram illustrating an application example applied to a computing system according to an exemplary embodiment of the inventive concept.

Referring to FIG. 15, a computing system 1500 may include a processor 1510, a system controller 1520, and a memory system 1400.

The computing system 1500 may further include a processor bus 1530, an expansion bus 1540, an input device 1550, an output device 1560, and a storage device 1570. The memory system 1400 may include at least one memory module 1420 and a memory controller 1410 for controlling the memory module 1420. The memory controller 1410 may be included in a system controller 1520.

The processor 1510 may execute various computing functions such as a function of executing specific software which executes specific calculations or tasks. For example, the processor 1510 may be a microprocessor or a central processing unit. The processor 1510 may be coupled to the system controller 1520 through the processor bus 1530 including an address bus, a control bus, and/or a data bus.

A host interface between the processor 1510 and the system controller 1520 may include a variety of protocols for data exchange.

The system controller 1520 may be connected to the expansion bus 1540 such as a peripheral component interconnection (PCI). In this case, the processor 1510 may control one or more input devices 1550 such as a keyboard or a mouse through a system controller 1520, one or more output devices 1560 such as a printer or a display device, one or more storage devices 1570 such as a hard disk drive (HDD), a solid storage device (SSD), or a CD-ROM.

The integrated protection circuit of FIG. 2 may be installed in the processor 1510, system controller 1520, or the memory system 1400 which the computing system 1500 of FIG. 15 includes. Thus, when the ESD pulse or the EOS pulse is received in the computing system 1500, the integrated protection circuit may protect the computing system 1500 from the ESD pulse or the EOS pulse with a simple configuration.

A display device as one of the output devices 1560 may be implemented with a thin film transistor liquid crystal display (TFT-LCD), a light-emitting diode (LED) display, an organic LED (OLED) display, an active-matrix OLED (AMOLED) display, or a flexible display.

The memory controller 1410 may control the memory module 1520 to execute a command provided by the processor 1510. The memory module 1420 may store data provided from the memory controller 1410 and may provide the stored data to the memory controller 1410.

The memory module 1420 may include a plurality of semiconductor memory devices, for example, a volatile memory including a dynamic random access memory (DRAM) and a static random access memory (SRAM), or a nonvolatile memory.

According to an embodiment of the inventive concept, as a circuit implementation size becomes compact or simple, a penalty about the area occupied by the chip (e.g., a semiconductor memory device) may be minimized or reduced.

As described above, an embodiment is disclosed by the drawings and specification. Here, the terminology used herein is for the purpose of describing particular embodiments only and is not intended to limit the invention. Therefore, it will be understood that various modifications and other equivalent embodiments are possible from this point by those skilled in the art.

While various aspects of the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An integrated protecting circuit of a semiconductor device, comprising:
    a first detector configured to detect an occurrence of an electrical over-stress between a first node to which a first voltage is applied and a second node to which a second voltage is applied;
    a second detector configured to detect an occurrence of an electrostatic discharge between the first and second nodes;
    a determination circuit configured to receive separate outputs of the first and second detectors at the same time and to generate a control signal based on the received outputs, wherein the determination circuit is configured to output the control signal having a first value when either the first detector detects the occurrence of the electrical over-stress between the first and second nodes or the second detector detects the occurrence of the electrostatic discharge between the first and second nodes, and when both the first detector detects the occurrence of the electrical over-stress and the second detector detects the occurrence of the electrostatic discharge; and
    a clamping device configured to perform a turn on/off operation in response to the control signal having the first value, such that a voltage between the first and second nodes is clamped into a constant voltage,
    wherein the first detector is configured to generate a first output during a first time interval of the electrical over-stress, and
    wherein the second detector is configured to generate a second output during a second interval, shorter than the first time interval, of the electrostatic discharge.

2. The integrated protecting circuit of claim 1, wherein the first detector comprises a resistor and a diode sequentially connected between the first and second nodes, and the first output of the first detector is a voltage between the resistor and the diode.

3. The integrated protecting circuit of claim 1, wherein the second detector comprises a resistor and a capacitor sequentially connected between the first and second nodes, and the second output of the second detector is a voltage between the resistor and the capacitor.

4. The integrated protecting circuit of claim 1, wherein the determination circuit comprises a NAND gate configured to generate a NAND response.

5. The integrated protecting circuit of claim 1, wherein the determination circuit comprises a NOR gate and an inverter.

6. The integrated protecting circuit of claim 1, further comprising a NOR gate and a PMOS transistor.

7. The integrated protecting circuit of claim 1, wherein the clamping device comprises an NMOS transistor.

8. The integrated protecting circuit of claim 1, wherein the clamping device comprises a PMOS transistor.

9. The integrated protecting circuit of claim 1, wherein the first node is connected to a power supply voltage pad and the second node is connected to a ground voltage pad.

10. The integrated protecting circuit of claim 1, wherein the first node is connected to a plurality of power supply voltage pads, and the second node is connected to a plurality of ground voltage pads.

11. An integrated protecting circuit of a semiconductor device, comprising:
   a first detector configured to detect an occurrence of an electrical over-stress between a first node to which a first voltage is applied and a second node to which a second voltage is applied;
   a second detector configured to detect an occurrence of an electrostatic discharge between the first and second nodes;
   a determination circuit configured to receive outputs of the first and second detectors and to generate a control voltage signal;
   a clamping adjustment circuit configured to receive the control voltage signal and a command and to generate adjustment control signals for adjusting a clamping intensity; and
   a plurality of clamping devices configured to perform a turn on/off operation in response to the adjustment control signals, respectively, such that a voltage between the first and second nodes is clamped into a constant voltage.

12. The integrated protecting circuit of claim 11, wherein the command is applied to be distinguishable during an active operation and a standby operation.

13. The integrated protecting circuit of claim 11, wherein the integrated protecting circuit is applied to a dynamic random access memory (DRAM).

14. The integrated protecting circuit of claim 11, wherein the first node is connected to a plurality of power supply voltage pads, and the second node is connected to a plurality of ground voltage pads.

15. An integrated protecting circuit of a semiconductor device, comprising:
   a first detector including a first resistor and a diode connected in series between a first node and a second node and configured to output a first voltage between the resistor and the diode;
   a second detector including a second resistor and a capacitor connected in series between the first node and the second node and configured to output a second voltage between the resistor and the capacitor;
   a determination circuit configured to receive the first voltage and the second voltage and output a control signal indicating an occurrence of stress between the first node and the second node when at least one of the first voltage and the second voltage is logical low state; and
   a clamping device configured to clamp a voltage difference between the first node and the second node in response to the control signal indicating the occurrence of the stress.

16. The integrated protecting circuit of claim 15, wherein the determination circuit comprises a NAND gate configured to receive the first and second voltages, wherein the NAND gate is configured to output the control signal indicating the occurrence of the stress when either the first voltage or the second voltage is the logical low state, and when both the first voltage and the second voltage is the logical low state.

17. The integrated protecting circuit of claim 15, wherein the clamping device comprises a gate-coupled NMOS transistor.

18. The integrated protecting circuit of claim 15, wherein the determination circuit comprises a NAND gate configured to receive the first and second voltages, wherein the NAND gate comprises a first and a second PMOS transistors and a first and a second NMOS transistors,
   wherein a first output line which carries the first voltage is connected a gate of the first PMOS transistor and a gate of the first NMOS transistor
   wherein a second output line which carries the second voltage is connected to a gate of the second PMOS transistor and a gate of the second NMOS transistor,
   wherein the first and second PMOS transistors are connected in parallel, and the first and second NMOS transistors are connected in series, and
   wherein an output line of the NAND gate which carries the control signal is connected to transistor node between a first set of the first and second PMOS transistors and a second set of the first and second NMOS transistors.

19. The integrated protecting circuit of claim 18, wherein the first set of the first and second PMOS transistors are connected to the first node, and the second set of the first and second NMOS transistors are connected to the second node.

20. The integrated protecting circuit of claim 18, wherein the first set of the first and second NMOS transistors are connected to the first node, and the second set of the first and second PMOS transistors are connected to the second node.

* * * * *